United States Patent
Shibata et al.

(10) Patent No.: US 7,829,913 B2
(45) Date of Patent: Nov. 9, 2010

(54) POROUS SUBSTRATE AND ITS MANUFACTURING METHOD, AND GAN SEMICONDUCTOR MULTILAYER SUBSTRATE AND ITS MANUFACTURING METHOD

(75) Inventors: Masatomo Shibata, Tokyo (JP); Yuichi Oshima, Tokyo (JP); Takeshi Eri, Tokyo (JP); Akira Usui, Tokyo (JP); Haruo Sunagawa, Tokyo (JP)

(73) Assignees: Hitachi Cable, Ltd., Tokyo (JP); NEC Corporation, Tokyo (JP)

( * ) Notice: Subject to any disclaimer, the term of this patent is extended or adjusted under 35 U.S.C. 154(b) by 1167 days.

(21) Appl. No.: 10/519,152

(22) PCT Filed: Jun. 26, 2003

(86) PCT No.: PCT/JP03/08173

§ 371 (c)(1),
(2), (4) Date: Aug. 10, 2005

(87) PCT Pub. No.: WO2004/003266

PCT Pub. Date: Jan. 8, 2004

(65) Prior Publication Data
US 2006/0046511 A1     Mar. 2, 2006

(30) Foreign Application Priority Data
Jun. 28, 2002  (JP)  ............................. 2002-190270

(51) Int. Cl.
*H01L 27/01* (2006.01)
(52) U.S. Cl. .................. 257/103; 257/79; 257/E33.018
(58) Field of Classification Search .................. 257/103, 257/E33.018, 79
See application file for complete search history.

(56) References Cited

U.S. PATENT DOCUMENTS 5,656,832 A    8/1997    Ohba et al.

(Continued)

FOREIGN PATENT DOCUMENTS

JP        2-81484        3/1990

(Continued)

OTHER PUBLICATIONS

Chinkyo Kim, et al., "Relaxation of anisotropic domain tilting along vertical growth direction in selectively lateral overgrown, GaN by hydride vapor phase epitaxy", Journal of Crystal Growth 208, 2000, pp. 804-808.

(Continued)

*Primary Examiner*—Cuong Q Nguyen
*Assistant Examiner*—Trang Q Tran
(74) *Attorney, Agent, or Firm*—Scully, Scott, Murphy & Presser, P.C.

(57) ABSTRACT

A structure of a substrate used for growing a crystal layer of a semiconductor, particularly a group-III nitride semiconductor and its manufacturing method. The substrate comprises two porous layers on a base. The mean opening diameter of the pores of the first porous laser, the outermost layer, is smaller than the means diameter of the pores in the second porous layer nearer to the base than the first porous layer. The first and second porous layers have volume porosities of 10 to 90%. More then 50% of the pores of the first porous layer extend from the surface of the first porous layer and reach the interface between the first and second porous layers. Even by a conventional crystal growing method, an epitaxial crystal of low defect density can be easily grown on the porous substrate.

13 Claims, 4 Drawing Sheets

U.S. PATENT DOCUMENTS

| | | | |
|---|---|---|---|
| 6,597,039 B2* | 7/2003 | Ohmi et al. | 257/347 |
| 2003/0017685 A1* | 1/2003 | Usui et al. | 438/483 |

FOREIGN PATENT DOCUMENTS

| | | |
|---|---|---|
| JP | 4-12092 | 1/1992 |
| JP | GB 2 344 461 A | 6/2000 |
| JP | EP 1 271 627 A2 | 1/2003 |

OTHER PUBLICATIONS

P. Fini, et al., "In situ, real-time measurement of wing tilt during lateral epitaxial overgrowth of GaN", Applied Physics Letters, vol. 76, No. 26, Jun. 26, 2000, pp. 3893-3895.

Tsvetanka S. Zheleva, et al., "Pendeo-Epitaxy-A New Approach for Lateral Growth of Gallium Nitride Structure", Department of Material Science and Engineering, 1999.

Masaru Kuramoto, et al, "Room-Temperature Continuous-Wave Operation of InGaN Multi-Quantum-Well Laser Diodes Grown on an n-GaN Substrate with a Backside n-Contact", Japanese Journal Applied Physics, vol. 38, Part 2, No. 2B, Feb. 15, 1999, pp. L184-L186.

Ok-Hyun Nam, et al., "Lateral Epitaxy of Low Defect Density GaN Layers via Organometallic Vapor Phase Epitaxy", Applied Physics Letters, vol. 71, No. 18, Nov. 3, 1997, pp. 2638-2640.

\* cited by examiner

POROUS SUBSTRATE AND ITS MANUFACTURING METHOD, AND GAN SEMICONDUCTOR MULTILAYER SUBSTRATE AND ITS MANUFACTURING METHOD

TECHNICAL FIELD

The present invention relates to a structure of a substrate used for growing a semiconductor crystal layer or the like, especially, a group III nitride semiconductor crystal layer, and a fabrication method therefor.

BACKGROUND ART

GaN series compound semiconductors such as gallium nitride (GaN), aluminum nitride (AlN), indium nitride (InN), indium gallium nitride (InGaN) and gallium aluminum nitride (GaAlN) have been in the limelight as materials for blue light-emitting diodes (LEDs) and laser diodes (LDs). Further, GaN series compound semiconductors begin to be applied and developed to elements for electronic devices by utilizing the characteristics of good heat- and environment-resistance.

GaN series compound semiconductors have difficulty in bulk crystal growth, and therefore a GaN self-standing substrate which can withstand practical use is still developing. A substrate for GaN growth which has currently been widely put into practical use is sapphire, and a method for epitaxially growing GaN on a single-crystal sapphire substrate by metal organic vapor phase epitaxy (MOVPE) is generally used.

Since the sapphire substrate has a different lattice constant from GaN, a single-crystal film cannot be grown by directly growing GaN on the sapphire substrate. For this reason, a method has been developed for once growing an AlN buffer layer on the sapphire substrate at low temperatures, relieving lattice strain by this low-temperature grown buffer layer, and growing GaN thereon (Japanese patent application laid-open No. 2-81484).

GaN single-crystal epitaxial growth has been made possible by using this low-temperature grown nitride layer as the buffer layer.

However, the lattice mismatch between the substrate and the crystal cannot be obviated even by this method, and GaN obtained has a dislocation of $10^{19}$-$10^{10}$ cm$^{-2}$. This defect becomes an obstacle in fabricating a GaN series LD.

In recent years, such growing techniques as ELO (Appl. Phys. Lett. 71 (18) 2638 (1997)), FIELO (Japan. J. Appl. Phys. 38, L184 (1999)), pendeoepitaxy (MRS Internet J. Nitride Semicond. Res. 4S1, G3. 38 (1999)) have been reported as methods for reducing defect density caused by the lattice constant difference between sapphire and GaN.

These growing techniques have been for preventing dislocation propagation from a base crystal by forming a patterned mask with SiO$_2$ or the like on GaN grown on a substrate of sapphire or the like, further selectively growing a GaN crystal from window portions of the mask, and covering the mask with the laterally growing GaN.

The development of these growing techniques has allowed the dislocation density in the GaN to be remarkably reduced to the order of $10^7$s cm$^{-2}$. For instance, Japanese patent application laid-open No. 10-312971 discloses one example of this techniques.

The above-mentioned ELO and other low-dislocation GaN growing techniques all require a process for forming a patterned mask with SiO$_2$ or the like on a substrate of sapphire or the like. This process comprises a SiO$_2$ film depositing step by CVD or the like, a resist coating step, a photolithography step, an etching and cleaning step, etc., so that it is very complicated and time-consuming.

Since fine processing technology is also required, there is the problem that the yield (reproducibility) of the mask formation is poor. Further, since the present process involves many heat treatment steps and cleaning step, the risk of contamination and damage of the substrate by handling is high.

While the above techniques involve the complicated process as explained above, the dislocation density of the GaN crystal obtained is not necessarily a satisfactory value for LD development.

This is considered to be because strain is caused in the growing GaN by the difference between areas having the mask and no mask for selective growth, and a crystal axis is thereby inclined, as reported in Appl. Phys. Lett., Vol. 76, No. 26 (2000) 3893-3895, J. Crystal Growth 208 (2000) 804-808, etc., for example.

DISCLOSURE OF INVENTION

Accordingly, it is an object of the present invention to provide a porous substrate and its fabrication method, and a GaN series semiconductor layered substrate and its fabrication method, to which, in order to obviate the above problems, can, without modification, be applied a conventional crystal growth method, and which is used for a base substrate for GaN crystal growth allowing GaN single-crystal epitaxial growth to have substantially smaller defect density than conventional.

(1) A porous substrate of the present invention is characterized by having a plurality of porous layers thereon, wherein the average opening diameter of pores in a porous layer of said plurality of porous layers positioned in an outermost surface is smaller than the average diameter of pores in a porous layer of said plurality of porous layers positioned on a substrate side relative to said porous layer positioned in said outermost surface.

(2) A porous substrate of the present invention is characterized by having a plurality of porous layers thereon, wherein the average opening diameter of pores in a porous layer of said plurality of porous layers positioned in an outermost surface is smaller than the average diameter of pores in a porous layer of said plurality of porous layers positioned on a substrate side relative to said porous layer positioned in said outermost surface; and the volume porosity of said plurality of porous layers is 10%-90%.

(3) A porous substrate of the present invention is characterized by having two porous layers thereon, wherein the average opening diameter of pores in a first porous layer of said two porous layers positioned in an outermost surface is smaller than the average diameter of pores in a second porous layer positioned on a substrate side relative to said first porous layer; and more than 50% of said pores in said first porous layer penetrate from the surface of said first porous layer to the interface between said first and second porous layer.

(4) A porous substrate of the present invention is characterized by having two porous layers thereon, wherein the average opening diameter of pores in a first porous layer of said two porous layers positioned in an outermost surface is smaller than the average diameter of pores in a second porous layer positioned on a substrate side relative to said first porous layer; more than 50% of said pores in said first porous layer penetrate from the surface of said first porous layer to the interface between said first and second porous layer; and the volume porosity of said first and second porous layer is 10%-90%.

(5) In the porous substrate of (3) or (4) above, said first porous layer comprises a metal material; said first porous layer comprises any of a metal oxide, a metal nitride, or a metal carbide; said second porous layer comprises a semiconductor material; said second porous layer comprises a group III nitride series compound semiconductor material; said first porous layer comprises TiN or Pt, and said second porous layer comprises GaN; said average opening diameter of said pores in said first porous layer is not more than 1 μm; or the film thickness of said first porous layer is not more than 1 μm.

(6) A fabrication method for a porous substrate of the present invention is characterized by including growing two or more different material layers on the substrate, heating said each layer, and thereby forming two or more porous layers with pores therein.

(7) A GaN series semiconductor layered substrate of the present invention is characterized by having a GaN series semiconductor layer grown on any porous substrate of (1)-(5) above.

(8) A fabrication method for a GaN series semiconductor layered substrate of the present invention is characterized by including growing two or more different material layers on the substrate, heating said each layer, thereby forming a porous substrate with two or more porous layers having pores therein, and growing a GaN semiconductor layer on that porous substrate.

BRIEF DESCRIPTION OF DRAWINGS

The preferred embodiments according to the invention will be explained below referring to the drawings, wherein:

FIGS. 2 (a)-(c) diagrammatically show a fabrication process for a porous substrate according to one embodiment of the present invention;

BEST MODE FOR CARRYING OUT THE INVENTION

The summary of the present invention lies in the use of a substrate having a bi-layered porous layer with more minute pores in its surface as a base substrate allowing reducing dislocations in a GaN epitaxial crystal. The porous substrate of the present invention may include a GaN layer formed on a substrate of sapphire or the like by means of epitaxial growth. A metal film such as a Ti layer or the like may be deposited on that GaN layer, which is subsequently heated in an atmosphere such as ammonia or the like to thereby form pores in the metal film so that a first porous layer of a metal nitride or the like is formed, while at the same time a part of the GaN layer is etched to form a second porous layer formed with high-density pores in its surface.

This allows the porous substrate in accordance with the present invention to be versatile in crystal growth using a method used in typical GaN series crystal epitaxial growth, namely, MOVPE, HVPE, MBE, etc.

In crystal growth on the porous substrate in accordance with the present invention, there occurs two kinds of growth modes according to the ways of combination of materials for the two porous layers.

In other words, a first growth mode occurs if a first porous layer that appears in a surface is made of material having higher affinity for a growing crystal than an internal second porous layer, and a second growth mode occurs if the first porous layer that appears in a surface is made of material having lower affinity for a growing crystal than the internal second porous layer.

The First Growth Mode:

If the first porous layer that appears in a surface is made of material having higher affinity for a growing crystal than the internal second porous layer, initial growing nuclei of the growing crystal occur preferentially in the surface of the first porous layer, and the growth proceeds further so that these growing nuclei bond to one another to eventually form a flat film. In this case, since the first porous layer serves to give a site for the nuclei occurring, the density of the crystal growth nuclei can be controlled by controlling the density of pores appearing in the surface. The density of dislocations occurring in the epitaxial crystal is correlated with the density of this initial nuclei occurring, and by lowering the density of the initial nuclei occurring, the density of dislocations is also decreased. It should be noted that, because when the density of the initial nuclei occurring is lowered, crystal thickness required until the crystal is flattened increases so that the flatness of the surface of the epitaxial layer tends to deteriorate, crystal growth conditions and the required thickness, flatness, etc. of the growing film need to be taken into consideration to optimize porosity of the porous substrate. Here, if the site for the nuclei occurring is only controlled, the base of the first porous layer does not have to be porous, but the second porous layer that is the base is inserted to thereby relieve strain of the base substrate and the growing crystal, so that lower-dislocation crystal can be grown. The reason for the pores of the first porous layer being required to be smaller than the pores of the second porous layer is because the crystal growth nuclei are caused to occur selectively on the first porous layer so that the occurrence of the nuclei in the second porous layer is controlled. If the crystal growth nuclei occur simultaneously from both of the first and second porous layers, then the probability of the growing crystal being polycrystallized increases.

The Second Growth Mode:

If the first porous layer that appears in a surface is made of material having lower affinity for a growing crystal than the internal second porous layer, initial growing nuclei for the crystal growth occur preferentially in the pores of the second porous layer, and the growing crystal reaches the surface of the first porous layer through the pores of the first porous layer. The crystal having appeared from the pores subsequently grows laterally over the surface of the first porous layer to eventually bond to form a flat film. In this growth mode, the first porous layer functions as a mask having minute windows and, as in a similar mechanism to ELO growth, propagation of dislocations occurring in the growing crystal is stopped by the first porous layer, which results in a reduction of dislocations in the crystal grown on the first porous layer. The reason for the pores of the first porous layer being required to be smaller than the pores of the second porous layer is because if the pores of the first porous layer are larger, it loses the mask function of stopping propagation of dislocations.

As described above, in the crystal growth on the porous substrate in accordance with the present invention, although there is the possibility of two kinds of growth modes occurring, both the modes have the effect of remarkably reducing dislocations in the epitaxial crystal obtained.

The reasons for optimal conditions for the pores will be explained next.

The average opening diameter of the pores formed in the first porous layer is required to be smaller than the average diameter of the pores formed in the second porous layer positioned directly underneath the first porous layer. The reason for that is because, in the case of the first growth mode, crystal growth nuclei are caused to occur selectively on the first porous layer so that the occurrence of nuclei in the second porous layer is controlled to prevent polycrystallization, and because, in the case of the second growth mode, the mask function of stopping propagation of dislocations is prevented from being lost.

Also, it is required that more than 50% of the total number of the pores provided in the first porous layer penetrates from the substrate surface to the interface with the second porous layer. The reason for that is because, in the case of the first growth mode, the pores have the strain relief effect on the growing crystal and the substrate, and because, in the case of the second growth mode, the pores serve as windows for causing the crystal that has developed in the first porous layer to reach the surface of the second porous layer.

Also, it is required that the first and second porous layers are different in material. The reason for that is because the difference is caused in affinity acting between the growing crystal and each layer to selectively cause the occurrence of growing nuclei. In case the first and second porous layers are the same in material, nuclei occur equally in both the porous layers, so that the risk of polycrystallization increases, as mentioned above.

Also, to develop the first growth mode, the first porous layer is required to be single-crystal. In the second growth mode, it is preferable that the first porous layer is also single-crystal. The crystallinity and flatness of the growing crystal tend to be enhanced. For this to happen, it is desirable that the second porous layer is also single-crystal, and the first porous layer is epitaxially growing in the second porous layer. When the second layer is a semiconductor layer, especially a group III-V compound semiconductor layer, it is relatively easy to cause a metal film to epitaxially grow thereon. When treatment is made to this layered substrate under suitable conditions, as will be described later in the embodiments, the metal film changes to any of a metal oxide, metal nitride, or metal carbide so that the structure with stacked porous layers such as the present invention is provided.

Of course, the summary of the present invention lies in the structure with stacked porous layers, and there can be various combinations in its material and manufacturing process other than described above.

It is desirable that the average opening diameter of the pores provided in the first porous layer is not more than 1 μm. The reason for that is because if the opening diameter of the pores is greater than 1 μm, in the case of the first growth mode, nuclei occur also from the inside of the pores, i.e., in the second porous layer so that the epitaxial layer is polycrystallized, and because in the case of the second growth mode, the mask function of stopping propagation of dislocations cannot be performed so that the low-dislocation effect decreases.

It is desirable that the film thickness of the first porous layer is not more than 1 μm. This is the desirable condition for preventing the polycrystallization of the epitaxial layer in the second growth mode. In case the average opening diameter of the pores in the first porous layer is not more than 1 μm, and the film thickness exceeds 1 μm, it is difficult to selectively develop growth nuclei only in the second porous layer so that the epitaxial layer is polycrystallized.

It is desirable that the volume porosity of the first porous layer is not less than 10%—not more than 90%, and that the pores are formed so as to be substantially uniformly dispersed in the porous layer. This is because if the volume porosity is less than 10% or exceeds 90%, the above-mentioned function as the porous film is lost. For a similar reason, the distribution is required to be uniform.

It is desirable that the volume porosity of the second porous layer is not less than 10%—not more than 90%, and that the pores are formed so as to be substantially uniformly dispersed in the porous layer. This is because in case the volume porosity is less than 10%, the above-mentioned function as the porous film is lost, or because in case the volume porosity exceeds 90%, there is lack of strength so that the first porous layer cannot be supported.

Although the porous substrate according to the present invention may be a substrate with a self-standing bi-layered porous layer, it may have a structure in which there is a base body (a substrate) of sapphire or the like with no pores in its base, and a bi-layered porous layer is formed on its surface.

In the present invention, even a modified structure with three or more stacked layers can have similar effects to the present invention.

In the case of the first growth mode, even a structure in which a third layer with no pores is inserted in the contact interface between the two porous layers can have similar effects to the present invention.

Embodiments of the present invention will hereinafter be explained referring to the accompanying drawings.

Embodiment 1

Figure 1:
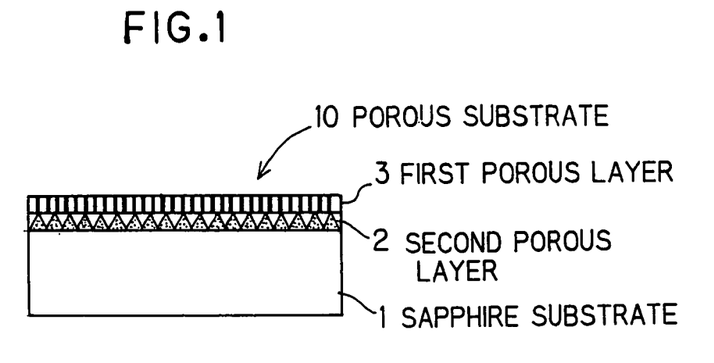
FIG. 1 diagrammatically shows a sectional structure of a porous substrate according to one embodiment of the present invention.

FIG. 1 illustrates a porous substrate 10 where a second porous layer 2 comprising GaN is formed on a single-crystal sapphire substrate 1, and a first porous layer 3 comprising a metal nitride such as TiN or the like is formed on the second porous layer 2.

The process for fabricating the porous substrate 10 illustrated in FIG. 1 will be explained.

Figure 2:
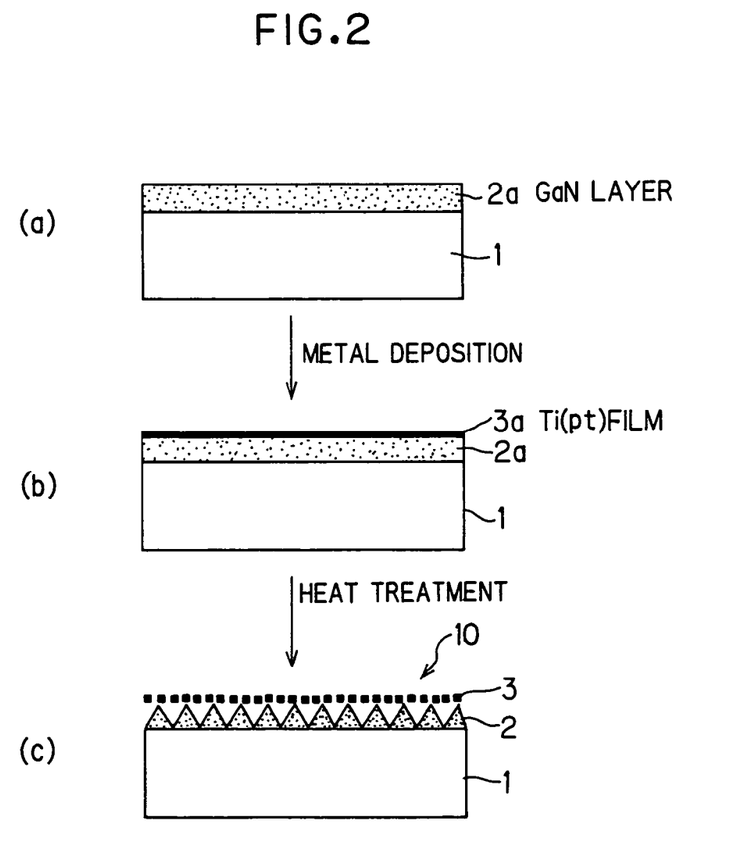

As shown in FIG. 2 (a), a GaN layer 2a was grown 500 nm on a single-crystal sapphire C-face substrate 1 with a diameter of 2 inches, with MOVPE, using TMG and $NH_3$.

Subsequently, a metal Ti film 3a was deposited 20 nm on the GaN layer 2a using a vacuum deposition apparatus (FIG. 2 (b)). This was inserted into an electric furnace, and was heated in a $H_2$ gas stream mixed with $NH_3$ 20%, at 1040° C. for 20 min.

As a result, as shown in FIG. 2 (c), part of the GaN layer 2a was etched to cause the occurrence of high-density pores so that a second porous layer 2 was formed, while at the same time the Ti film 3a was nitrided into TiN to form a first porous layer 3 formed with high-density minute holes of submicrons in its surface.

Figure 3:
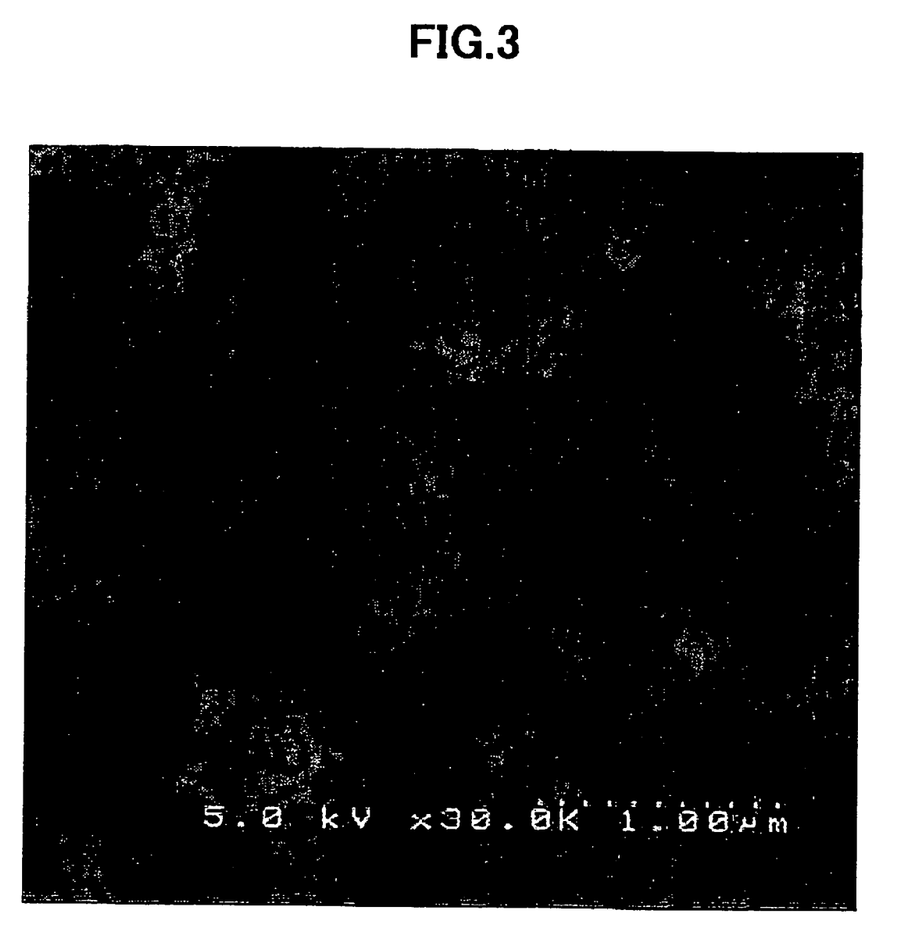
FIG. 3 is a surface SEM photo of a porous substrate according to one embodiment of the present invention.
Figure 4:
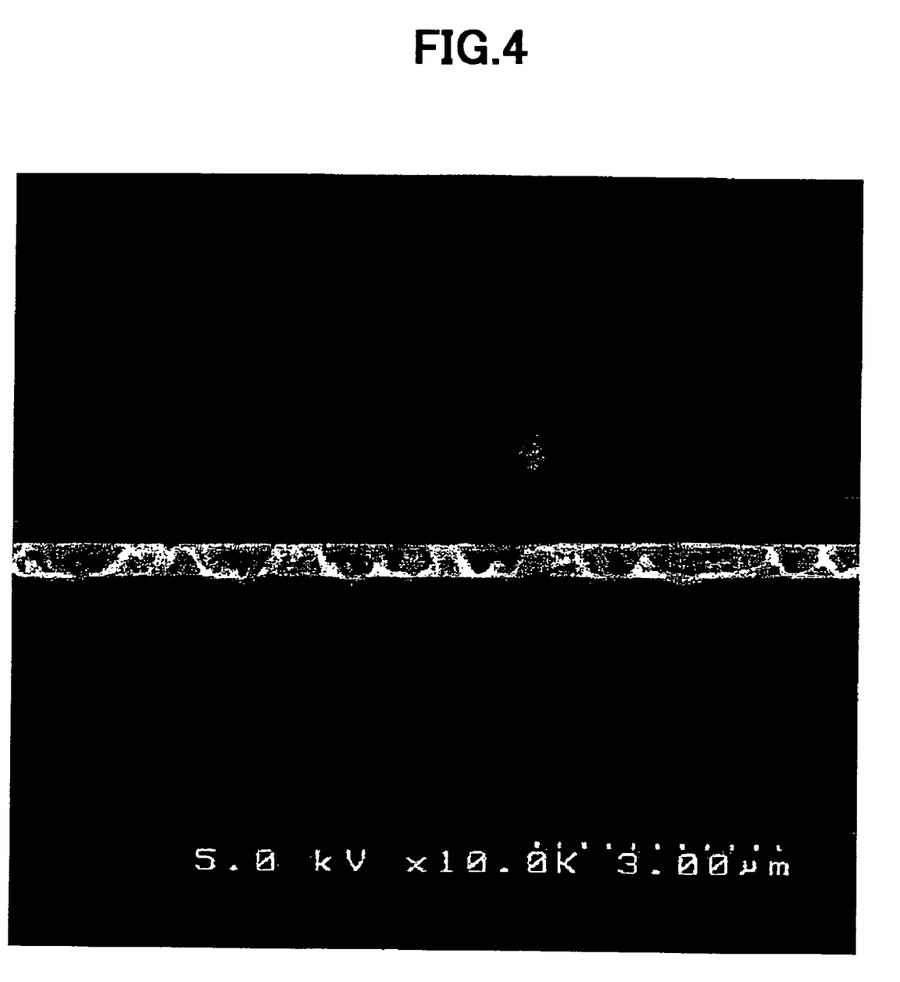
FIG. 4 is a sectional SEM photo of a porous substrate according to one embodiment of the present invention.

FIG. 3 is a surface SEM photo of the porous substrate 10 thus obtained, and FIG. 4 is a cross-sectional SEM photo of the porous substrate 10.

As shown in FIG. 3, in the first porous layer 3 that constitutes the surface of the porous substrate 10, through-holes having a diameter of the order of 0.1 μm (in FIG. 3, portions shown in black) are formed substantially uniformly in the surface.

Also, as shown in FIG. 4, in the second porous layer 2, pores having a diameter of the order of 1 μm (in the middle portion of FIG. 4, pores between horizontally aligned peak-shaped GaN crystals) larger than the pores of the first porous layer 3 are formed substantially uniformly in the surface so that the network TiN layer (the first porous layer 3) is supported at the peaks of peak-shaped GaN crystals.

Embodiment 2

Figure 5:
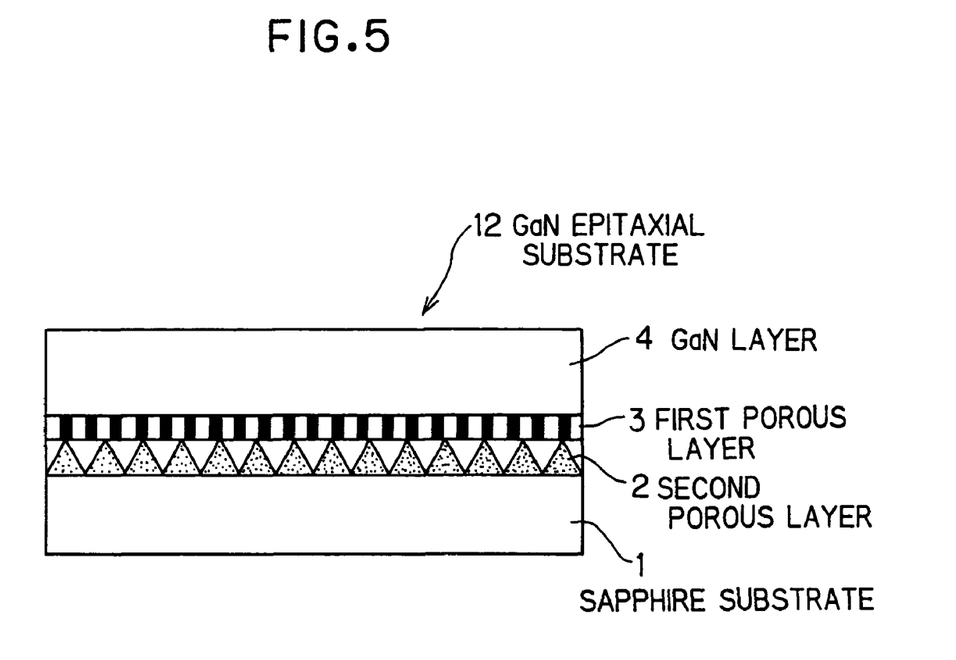
FIG. 5 diagrammatically shows a sectional structure of a GaN series semiconductor layered substrate according to one embodiment of the present invention.

FIG. 5 shows an example where a GaN crystal is grown on a porous substrate 10 shown in embodiment 1, with MOVPE.

The porous substrate 10 fabricated with the method of embodiment 1 was inserted into an MOCVD furnace, and was heated in an ammonia stream mixed with $H_2$ 20%, at 1050° C., for 30 min. Subsequently, in the same furnace, a GaN film 4 was grown 2 μm on the TiN layer (the first porous layer 3) at 1050° C., using TMG and $NH_3$. Nomarski microscope and SEM observations verified that the surface of a GaN epitaxial substrate 12 obtained was very flat and in a good surface state with less microscopic irregularity in its surface, compared to an existing GaN epitaxial substrate grown on a sapphire substrate via a low-temperature growth buffer layer.

AFM (atomic force microscope) observation verified that the GaN single-crystal substrate 12 obtained had high crystalline quality, by showing that the measured density of pits (corresponding to dislocations) observed in the surface of the GaN epitaxial substrate 12 was very small, $5\times10^6$ cm$^{-2}$.

X-ray diffraction measurement verified that this substrate 12 had good and uniform crystallinity, by showing that the full width at half maximum of a GaN (0002)-face diffraction locking curve was about 90 sec. at any positions of measurement in the substrate surface, and the full width at half maximum of a (10-10)-face diffraction locking curve was also about 140 sec. at any positions of measurement in the substrate surface.

Embodiment 3

An example of using Pt as first porous layer 3 material and GaN as second porous layer 2 material will be explained, referring to FIG. 2 as in Embodiment 1.

A substrate 8 was prepared having GaN layer 2a grown 0.5 μm a single-crystal sapphire C-face substrate 1 with a diameter of 2 inches, with MOVPE, using TMG and $NH_3$. A metal Pt film 3a was deposited 20 nm on the GaN layer 2a, and this was inserted into an electric furnace, and was heated in an atmosphere, at 850° C., for 20 min. As a result, a second porous layer 2 with high-density pores analogous to FIG. 4 was formed in the GaN layer 2a, while a first porous layer 3 with high-density holes of submicrons was formed in the Pt film 3a.

Embodiment 4

An example of growing a GaN crystal with HVPE on a porous substrate 10 shown in embodiment 3 will be explained.

The porous substrate 10 fabricated with the method of Embodiment 3 was inserted into an HVPE furnace, and GaN was deposited 50 μm. Materials used for growth were $NH_3$ and GaCl, and $N_2$ was used as the carrier gas. GaCl and $NH_3$ partial pressures in the supply gas were $8\times10^{-3}$ atm and $8\times10^{-2}$ atm, respectively. The growing was performed at normal pressure, and the growth temperature was 1050° C.

Microscope and SEM observations verified that the surface of a GaN epitaxial substrate obtained was very flat and that its surface state was as good as or better than that of an existing GaN epitaxial substrate ELO grown on a sapphire substrate forming a stripe mask with $SiO_2$. X-ray diffraction measurement verified that this substrate had good and uniform crystallinity, by showing that the full width at half maximum (FWHM) of GaN (0002)-face diffraction was about 100 sec. at any positions of measurement in the substrate surface, and the full width at half maximum (FWHM) of (10-10)-face diffraction was about 140 sec. at any positions of measurement in the substrate surface. Also, it was found that the dislocation density of the GaN epitaxial substrate obtained, which was measured at etch pits obtained as a result of immersing a sample in a mixture of thermal phosphoric acid and sulfuric acid (250° C.), was very small, $1\times10^7$ cm$^{-2}$. Further, AFM (atomic force microscope) measurement verified that the GaN epitaxial substrate obtained had high crystallinity, by showing that the measured density of pits in its surface was also very small, $5\times10^6$ cm$^{-2}$.

Although the examples of GaN crystal growth have been explained in the above-described embodiments, the present invention may be versatile in nitride series crystals, such as crystals of AlGaN, InGaN, etc. Further, even in the application to crystal growth of materials other than GaN series materials, low defect density crystal growth is made possible by a similar mechanism.

In particular, the present invention is effective in the application to material series required for hetero-epitaxial growth where a crystal is grown on a substrate made of a different material from a growth crystal.

The porous substrate of the present invention can be applied to various crystal growth methods and devices. The porous substrate of the present invention may be used in methods used in typical GaN series crystal epitaxial growth, namely, MOVPE, HVPE, MBE, etc. A low dislocation density epitaxial growth crystal can easily be obtained by growing a GaN crystal on the porous substrate of the present invention, using any of the above-mentioned methods. Further, a high-power, high-reliability light-emitting device can be fabricated by growing, on the porous substrate of the present invention, an epitaxial structure having the function of a device such as a light-emitting diode (LED), a laser diode (LD) or the like. Also, use can be made even as a substrate for the fabrication of an electronic device such as a GaN-HEMT.

INDUSTRIAL APPLICABILITY

According to the porous substrate of the present invention, even in case of use of a conventional crystal growth method, a low defect density epitaxial crystal can easily be grown on the porous substrate. In particular, when the porous substrate is applied to GaN series epitaxial crystal growth, a low dislocation density epitaxial growth GaN wafer, etc. can easily be obtained. This allows a high-power and high-reliability GaN series device such as a light-emitting diode (LED), a laser diode (LD) or the like to be formed on that wafer.

The porous substrate of the present invention can be fabricated with the simple step of only heating a multilayered film. Thus, the fabrication process for the porous substrate of the present invention is low-cost-compared to a conventional process such as ELO or the like, which requires a complicated step and apparatus, such as a photolithography step or the like. Also, no skills are required because of high reproducibility. Further, since the step is simplified, a substrate for epitaxial crystal growth can be fabricated for a relatively short period of time.

The present application is based on Japanese patent application No. 2002-190270, the entire contents of which are incorporated herein by reference.

What is claimed is:

1. A porous substrate, comprising:
a substrate and;
a plurality of porous layers on the substrate,
wherein an average opening diameter of pores in a first porous layer of said plurality of porous layers positioned in an outermost surface is smaller than an average diameter of pores in a second porous layer of said plurality of porous layers positioned on a substrate side relative to said first porous layer, said first porous layer comprising a metal material, a metal oxide, a metal nitride, a metal carbide, or combinations thereof, and said second porous layer comprising a semiconductor material.

2. A porous substrate, comprising:
a substrate; and
a plurality of porous layers on the substrate,
wherein an average opening diameter of pores in a first porous layer of said plurality of porous layers positioned in an outermost surface is smaller than an average diameter of pores in a second porous layer of said plurality of porous layers positioned on a substrate side relative to said first porous layer, said first porous layer comprising a metal material, a metal oxide, a metal nitride, a metal carbide, or combinations thereof, and said second porous layer comprising a semiconductor material; and a volume porosity of said plurality of porous layers is 10%-90%.

3. A porous substrate, comprising:
a substrate; an
two porous layers on the substrate,
wherein an average opening diameter of pores in a first porous layer of said two porous layers positioned in an outermost surface is smaller than an average diameter of pores in a second porous layer positioned on a substrate side relative to said first porous layer, said first porous layer comprising a metal material, a metal oxide, a metal nitride, a metal carbide, or combinations thereof, and said second porous layer comprising a semiconductor material; and more than 50% of said pores in said first porous layer penetrate from a surface of said first porous layer to an interface between said first and second porous layer.

4. A porous substrate, comprising:
a substrate; and
two porous layers on the substrate,
wherein an average opening diameter of pores in a first porous layer of said two porous layers positioned in an outermost surface is smaller than an average diameter of pores in a second porous layer positioned on a substrate side relative to said first porous layer, said first porous layer comprising a metal material, a metal oxide, a metal nitride, a metal carbide, or combinations thereof, and said second porous layer comprising a semiconductor material; more than 50% of said pores in said first porous layer penetrate from a surface of said first porous layer to an interface between said first and second porous layer; and a volume porosity of said first and second porous layer is 10%-90%.

5. The porous substrate according to claim 3, wherein said first porous layer comprises a metal material.

6. The porous substrate according to claim 3, wherein said second porous layer comprises a group III nitride series compound semiconductor material.

7. The porous substrate according to claim 3, wherein said first porous layer comprises TiN or Pt, and said second porous layer comprises GaN.

8. The porous substrate according to claim 3, wherein said average opening diameter of said porosity in said first porous layer is not more than 1 µm.

9. The porous substrate according to claim 3, wherein the film thickness of said first porous layer is not more than 1 µM.

10. A GaN series semiconductor layered substrate, comprising a GaN series semiconductor layer grown on the porous substrate defined in claim 1.

11. A GaN series semiconductor layered substrate, comprising a GaN series semiconductor layer grown on the porous substrate defined in claim 2.

12. A GaN series semiconductor layered substrate, comprising a GaN series semiconductor layer grown on the porous substrate defined in claim 3.

13. A GaN series semiconductor layered substrate, comprising a GaN series semiconductor layer grown on the porous substrate defined in claim 4.

* * * * *